Figure 1:
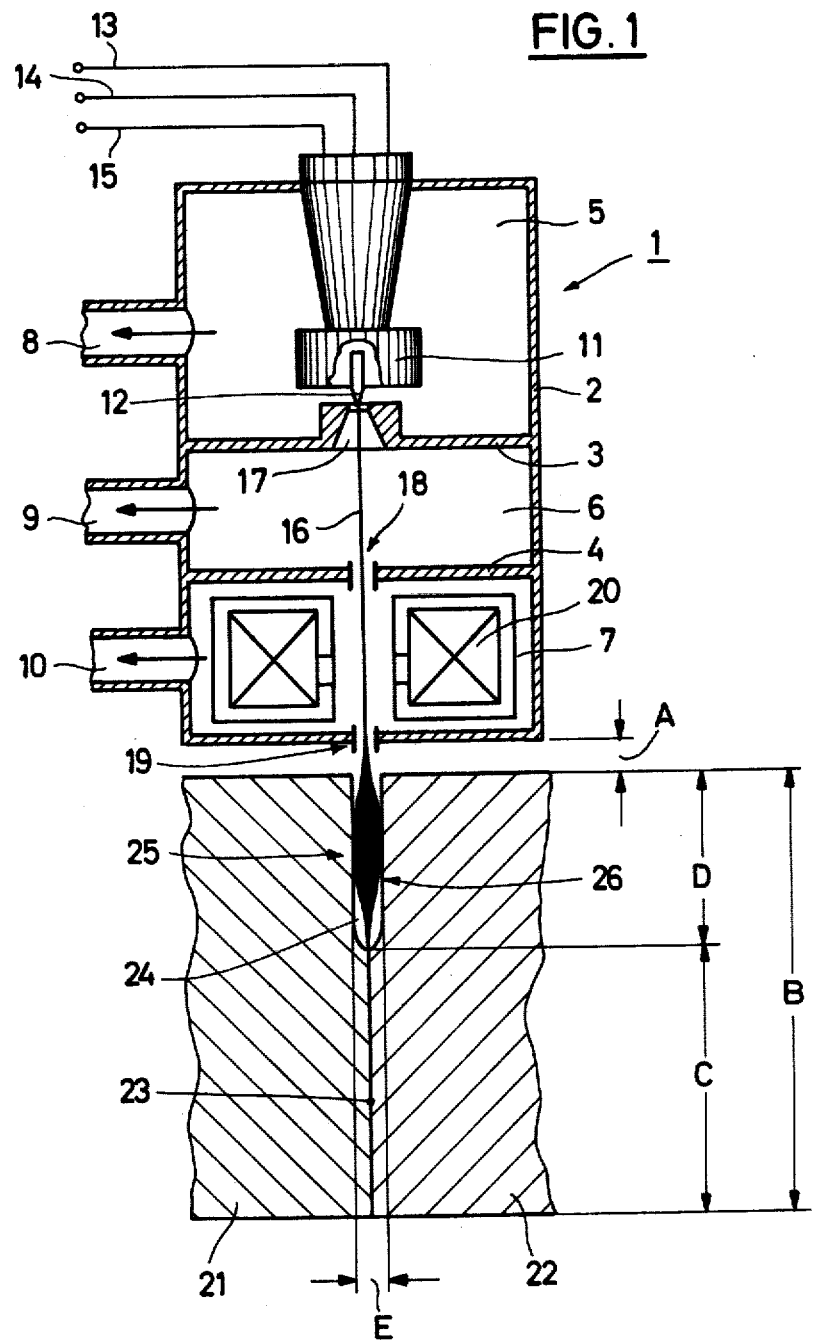

United States Patent [19]

Dietrich et al.

[11] 4,304,979
[45] Dec. 8, 1981

[54] METHOD AND APPARATUS FOR ELECTRON BEAM WELDING AT ELEVATED PRESSURES

[75] Inventors: Walter Dietrich, Hanau am Main, Fed. Rep. of Germany; Fred H. Samuelson, Suffield, Conn.

[73] Assignee: Leybold-Heraeus GmbH, Cologne, Fed. Rep. of Germany

[21] Appl. No.: 954,140

[22] Filed: Oct. 24, 1978

[51] Int. Cl.³ ............................................. B23K 15/00
[52] U.S. Cl. ...................... 219/121 EC; 219/121 ED; 219/121 EL; 219/121 EQ; 219/121 ER; 219/121 EZ
[58] Field of Search ................. 219/121 EB, 121 EM, 219/121 EC, 121 ED, 121 EL, 121 EQ, 121 ER, 121 ES, 121 EZ, 121 EU

[56] References Cited

U.S. PATENT DOCUMENTS

| | | | |
|---|---|---|---|
| 3,156,811 | 11/1964 | Barry | 219/121 EB |
| 3,162,749 | 12/1964 | Peracchio | 219/121 EB |
| 3,174,026 | 3/1965 | Bowers et al. | 219/121EM |
| 3,389,240 | 6/1968 | Sciaky | 219/121 EB |
| 3,428,776 | 2/1969 | Stauffer | 219/121 EM |
| 3,626,140 | 12/1971 | Peyrot | 219/121 EB |
| 3,972,599 | 8/1976 | Engel et al. | 219/121 L X |
| 4,159,440 | 6/1979 | Little | 219/121 EB X |
| 4,176,270 | 11/1979 | Sailas | 219/121 ED |

FOREIGN PATENT DOCUMENTS

| | | | |
|---|---|---|---|
| 2726812 | 12/1977 | Fed. Rep. of Germany | 219/121 EM |
| 1401318 | 4/1965 | France | 219/121 EB |
| 1010307 | 11/1965 | United Kingdom | 219/121 EB |

*Primary Examiner*—C. L. Albritton
*Attorney, Agent, or Firm*—Sprung, Felfe, Horn, Lynch & Kramer

[57] ABSTRACT

Method and an apparatus whereby electron beam deep welding can be performed at pressures of more than 10 millibars, especially under atmospheric conditions, without the need for complex apparatus. This is achieved by guide surfaces disposed between a seam and an electron beam source, so as to reflect the diverging electrons and at the same time reduce the free access of the ambient gas atmosphere. The electron reflection and the simultaneous blocking off of gases is achieved by guide surfaces substantially parallel and symmetrical with the beam axis which extend along the beam for at least ten millimeters. The distance between the guide surfaces through the center of the electron beam is greater than the diameter which the beam has upon entering into the higher pressure area.

14 Claims, 4 Drawing Figures

METHOD AND APPARATUS FOR ELECTRON BEAM WELDING AT ELEVATED PRESSURES

BACKGROUND

This invention relates to an electron beam butt welding process performed at pressures of 10 millibars and more, especially at atmospheric pressure.

Electron beam welding at gas pressures of from 10 millibars to standard pressure and over, in which the electron beam is produced in a vacuum and passes into a region of higher pressure or into the free atmosphere, that is, electron beam welding in which the workpieces are situated in conditions wherein the air pressure is higher than this vacuum, is already known. Due to the inevitable collisions which take place between electrons and gas molecules, however, the electron beam becomes divergent after traveling a distance of only a few millimeters, so that its power density, with respect to the available beam cross section, is reduced proportionally. Consequently, the known method has been limited to the welding of relatively thin workpieces where the distance between the workpiece and the aperture through which the beam emerges from the electron gun is short.

In electron beam welding, vaporization and spattering of the molten workpiece takes place, resulting in an undesirable depositing of material on the gun orifice, which can also be called a nozzle. To prevent contamination of the nozzle by the welding process itself, the weld site must be no closer than a certain minimum distance away from the aperture through which the electron beam emerges from the electron gun. In conflict with this requirement is the fact that this distance can be no greater than some 25 millimeters because the electron beam, which emerges from the electron gun well focused and with a very high power density, is so severely dissipated along this distance to the workpiece, for the reasons stated above, that its power density drops to a level which is no longer sufficient to perform the deep welds which are possible in electron beam welding under vacuum.

Whereas in the case of high-vacuum electron beam welding, the depth-to-width ratio of the weld can be as great as 50:1, it is not possible normally to achieve depth-to-width ratios of more than 4:1 with an electron beam that enters the atmosphere.

Electron beam welding under atmospheric conditions has the considerable advantage that large and/or complexly shaped workpieces can be welded without the need for a vacuum chamber of the size needed to accommodate them. This relates especially to the longitudinal welding of pipes and the butt welding of individual sections of pipe. In order to be able to dispense with large-capacity vacuum chambers in welding such workpieces, it is also known to use electron beam guns which are sealed off against the workpiece surface by means of a sealing strip or an especially shaped cascade pressure frame, so that a chamber of limited size is created for the establishment of a sufficiently good vacuum. However, such a solution of the problem is complex and must be tailored to the workpiece dimensions and shapes, so that this method has not achieved any appreciable acceptance thus far (German Auslegeschrift No. 1,515,201).

SUMMARY

This invention provides a method and an apparatus whereby deep welding can be performed at pressures of more than 10 millibars, especially under atmospheric conditions, without the need for complex apparatus. The term "deep welding," used herein refers to electron beam welding whereby the workpieces are joined together by means of narrow, deep welds with a depth-to-width ratio of greater than 4:1.

This is achieved in accordance with the invention, in the process described above, in that guide surfaces are disposed between the seam and the electron beam source, so as to reflect the diverging electrons and at the same time reduce the free access of the ambient gas atmosphere. The electron reflection and the simultaneous blocking off of gases can be achieved in an especially simple and effective manner if the generatrices of the guide surfaces are substantially parallel and symmetrical with the beam axis and extend along the beam for at least ten millimeters, preferably at least twenty millimeters, and the distance between the guide surfaces through the center of the electron beam is greater than the diameter which the beam has upon entering into the higher pressure area.

DESCRIPTION

Such guide surfaces can be created or prepared in different ways. First, it is possible to use as guide surfaces, portions of the edges of the workpieces which are produced by widening the seam over a portion of the workpiece thickness B to form a groove or gap, the unwidened portion of the seam being welded together first, preferably without the addition of material, and then the gap is welded with the use of additional material. In other words, the workpieces are subjected at the location of the seam to an additional machining whereby a portion of the workpiece material is removed, so that a thin gap is formed having a depth which amounts to a part of the workpiece thickness, this part, in the case of thicknesses exceeding 50 mm, being smaller than half of the workpiece thickness. At the remaining part of the workpiece thicknesses the workpieces are in contact with one another in the manner of the seam that is conventionally used in electron beam welding, that is, they are "butted" together.

It is also possible, however, to arrange a separate body opposite the seam, this body being a part of the apparatus, being usable virtually indefinitely, and being provided with the guide surfaces.

By the method of the invention and by the means corresponding thereto, it is possible to guide the beam emerging into an area of higher pressure, especially atmospheric pressure, back toward the workpieces, and to concentrate it and largely prevent it from being dissipated. The invention is based upon the exploitation of the fact that, when electrons strike surfaces at a low or grazing angle, they are reflected to a very great percentage virtually without loss. In addition, the electron beam, after entering the area of higher pressure, displaces the air molecules in its core and forms a "corridor" of very low gas density leading to the workpiece. The greater the power of the electron beam is, the more pronounced this effect is. If the ambient atmosphere were permitted to flow back freely, it would militate against the formation of this corridor. The method of the invention has the additional effect of inhibiting the return of the ambient atmosphere. This additionally promotes the formation of the corridor.

This shielding from the ambient atmosphere can be substantially enhanced if, when the guide surfaces are in the form of boundary surfaces of a gap running parallel to the seam, air heating is performed in the gap ahead of and behind the electron beam by means of additional energy sources, preferably by plasma burners.

The term, "gap," which is used herein refers to all spaces which are defined by substantially parallel, confronting walls and extend over at least a portion of the length of the seam. It applies also, especially when a separate body is disposed over the seam, to slits disposed in this body, whose length is defined by partitions joining the parallel wall surfaces together at the ends of the slit.

It has surprisingly been found that, when the method of the invention is used, the former limitations of the use of electron beam welding at the higher pressures up to atmospheric pressure can be eliminated. Thus it was found that, with an electron beam of 25 kW of power, and with an accelerating voltage of 200 kV and a welding rate of 60 millimeters per minute, a weld depth of 75 mm was achieved at a maximum weld width of 4 to 6 mm. If the application width is considerably increased, the weld quality approaches the weld qualities achievable under a vacuum.

The method of the invention is especially important in thick-wall welding. This kind of welding is used mostly for the purpose of welding large vessels of great wall thickness. In the application of the method of the invention, the sealing strips or cascade pressure shielding described in the beginning are unnecessary or, in the case of partial vacuums between ten millibars and atmospheric pressure, it is no longer necessary in the form in which it has been used heretofore, so that the expense involved in the welding setup can be substantially reduced. Pressures between ten millibars and just below atmospheric pressure can, of course, be produced merely by means of a chamber and a cascade pressure frame laid upon the workpieces and by means of a cascade pressure system associated with the cathode chamber, but the constructive and procedural measures to be applied in this pressure range are substantially easier than those required by the conventional high vacuum method. The application of the invention to the welding of pipelines on land and on pipeline laying ships is of particular interest.

The separate body which is provided in accordance with the further invention, and which has guide surfaces for the electron beam, can be provided either with cooling passages or with a heating system. Cooling passages protect the guide surfaces. The heating of the body by a heating system results in a further rarefaction of the gas atmosphere about the electron beam, thereby additionally combatting the divergence of the beam. Guide surfaces which are at a higher temperature have the additional effect of reducing the undesired condensation of metal vapors.

Additional embodiments of the method of the invention and of an apparatus also in accordance with the invention are described in connection with the accompanying drawing.

Examples of the embodiment of the invention will be described hereinbelow with reference to the appended drawings, wherein:

FIG. 1 is a longitudinal cross sectional view taken through an electron gun in conjunction with two workpieces to be welded together, in which the guide surfaces are formed by a widening of the seam in the workpieces themselves.

Figure 2:
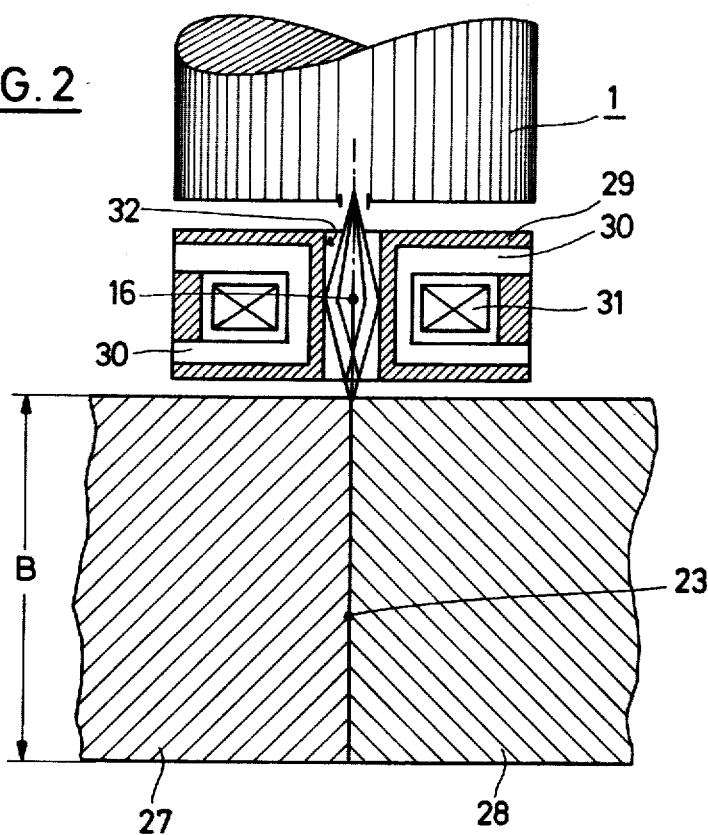
Figure 3:
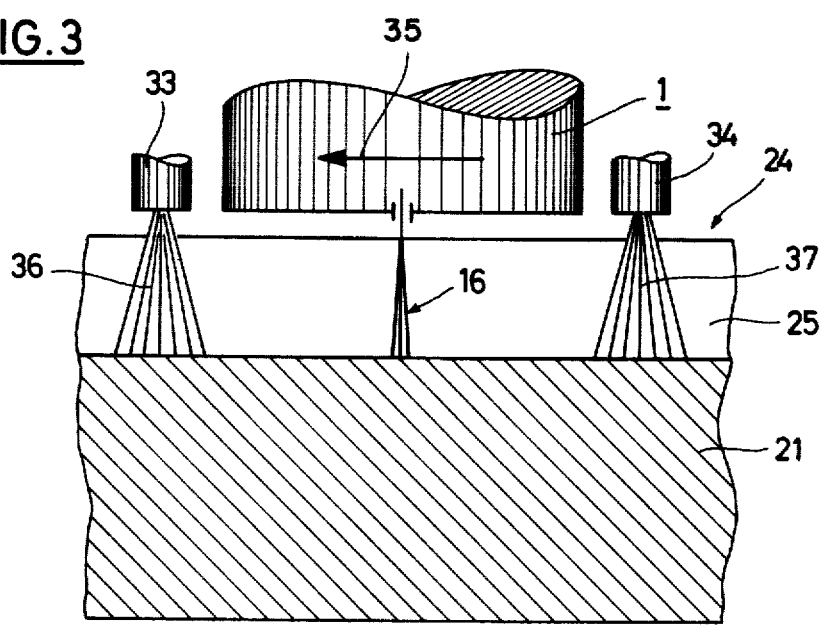
Figure 4:
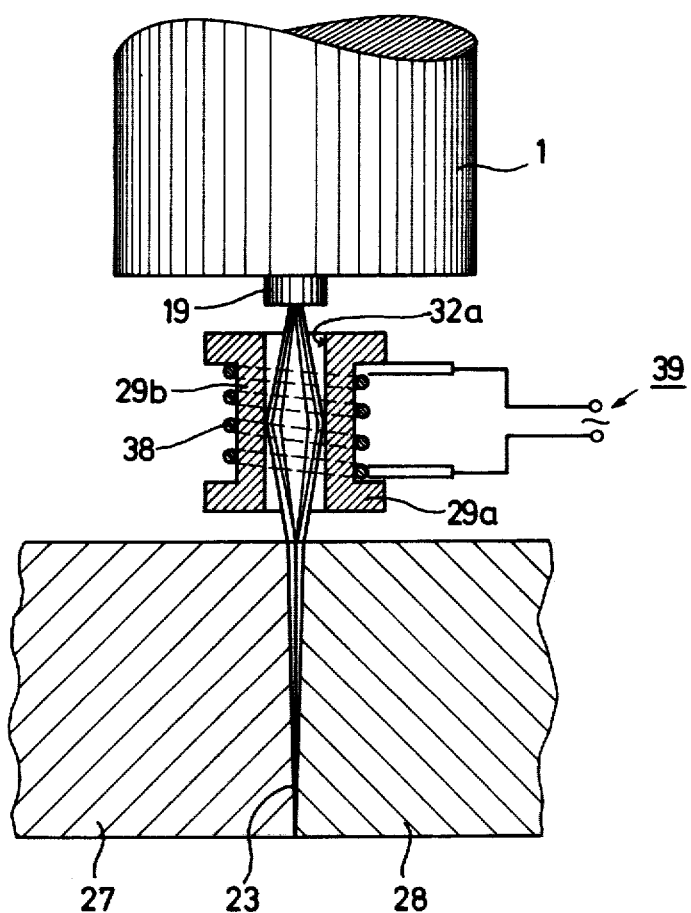

FIG. 2 is a cross sectional view similar to FIG. 1, except that the guide surfaces are formed by a separate body having cooling passages, situated between the electron gun and the workpieces, FIG. 3 is a sectional view taken at a right angle to FIG. 1, with an additional arrangement of plasma burners whose plasma jets extend into the gap ahead of and in back of the electron beam, and FIG. 4 is a sectional view similar to FIG. 2, except that the separate body is provided with a heating system instead of cooling passages.

FIG. 1 represents an electron gun 1 of conventional construction having a casing 2 which is separated by partitions 3 and 4 into three chambers 5, 6 and 7. The chambers can be evacuated separately and to different pressures as desired, through vacuum lines 8, 9 and 10, the lowest pressure generally being produced in chamber 5.

A directly heated cathode 12 is disposed in chamber 5 within a beam forming electrode 11 (Wehnelt cylinder). The high voltage and the heater voltage are fed to the electrode system through lines 13, 14 and 15.

During operation, the cathode 12 produces an electron beam 16 along the axis of the gun. Narrow apertures 17, 18 and 19 are provided in the casing in the partitions 3 and 4 also along the gun axis and can be referred to as "nozzles." The apertures form together with chambers 5, 6 and 7 a "cascade pressure system" which maintains the vacuum in chamber 5 against the atmosphere. The partition 3 serves additionally as an accelerating anode. A focusing lens 20 is provided in chamber 7.

The electron beam 16 emerges from the aperture 19 and, for the reasons stated above, it has a tendency to diverge. Underneath the aperture 19, at a distance A of at least 10 mm, preferably of at least 20 mm, there are situated two workpieces 21 and 22 having a thickness B, which are to be welded together. These workpieces abut one another at a seam 23 having a depth C. The remainder of the depth of the seam has been widened by the removal of material to form a gap 24 tapering to a depth D; the ratio of D to B should be between 1:10 and 1:2.

The sidewalls of gap 24 extending parallel to the seam 23 are the guide surfaces for the electron beam 16 which is diverging slightly at this point. The distance between the guide surfaces 25 and 26 through the center of the electron beam 16 is greater than the beam diameter immediately after it emerges from the aperture 19. The optimum gap width E can easily be found by simple testing, observing the rule that the electrons in the margin of the divergent electron beam are to strike the guide surfaces at a very low angle, so as to optimize reflection. In general, the gap width E will be between one and five millimeters. In the welding process, the procedure, as represented in FIG. 1, is first to weld the workpieces together in the area of the seam 23, i.e., within the dimension C (without the addition of material), and then the gap 24 is filled up and welded with the addition of material.

In FIG. 2 two workpieces 27 and 28 are represented, which abut one another on their entire thickness B at a seam 23. Between the electron gun 1 and the workpieces 27 and 28, i.e., in front of the seam, there is disposed a cooled body 29 which consists of copper and has in its interior cooling passages 30 as well as electronic-optical means 31 (focusing lens). The cooled body 29 has, on the basis of a bore parallel to the beam axis a cylindrical inner wall, which in the present case forms the guide surface. The cooled body 29 is best fastened to the electron gun 1 and can be moved together therewith, if desired, parallel to the seam (weld) 23. Also with regard to the guide surface 32 and its diameter the rule applies that the marginal electrons of the beam 16 are to strike it at a very acute angle. In the present case, the workpieces 27 and 28 can be welded together in one pass without the need of filling up the gap 24 as was necessary in the case of FIG. 1.

It is, of course, possible to use, instead of a rotation-symmetrical, cooled body 29, two rail-like cooled bodies which form between them an elongated gap parallel with the seam 23. In this case the cooled body or the two parts thereof would be disposed so as to be stationary with respect to the workpieces.

In FIG. 3, a cross section has been taken along the seam 23 (FIG. 1) so that only one of the two workpieces 21 can be seen, along with the guide surface 25 of the gap 24. In the welding direction (arrow 35), in front and in back of the electron beam 16, energy sources 33 and 34 are disposed above the gap, in the form, in the present case, of plasma burners, which direct the plasma jets 36 and 37 into the gap 24, thereby producing a heating of the air. Plasma curtains are thereby formed which inhibit the flow of air longitudinally of the gap 24. In this manner the electron beam 16 is effectively shielded against the surrounding atmosphere. The energy sources produce a pressure gradient in front of and in back of the electron beam 16, so that an abrupt change of pressure in the vicinity of the electron beam is prevented.

In FIG. 4, two workpieces 27 and 28 are represented, which abut one another on their entire thickness at a seam 23, similarly to FIG. 2. Between the electron gun 1 and the workpieces there is disposed a heated body 29a which consists of a tubular piece 29b on whose outer surface a heating coil 38 is wound in the form of an insulated resistance wire. The interior of the tubular piece 29b is formed by the cylindrical guide surface 32a. The body 29a is likewise best fastened to the electron gun 1 and in this case it is moved with the gun along the seam (weld) 23. The heating coil 38 is connected to a power source 39.

The following example is intended to further illustrate the invention without limiting same.

In a welding process in accordance with FIG. 1, the two workpieces 21 and 22 consisted of plates of a heat-resistant steel, and they had a thickness B of 100 mm. The gap depth D amounted to 25 mm and the gap width E to 5 mm. This resulted in a seam depth C of 75 mm. With an electron beam of 25 kW power and an acceleration voltage of 200 kV, the two workpieces were welded together at a rate of 60 mm per minute. Tests of this weld showed that the joint over the entire depth of the seam (now the weld) 23 was comparable, over the entire length of the weld, to a weld made in a vacuum. The gap 24 was then welded shut by the addition of compatible weld material. In this manner we succeeded in joining perfectly together workpieces having a thickness of 100 mm. The weld in the area of the former seam 23 had a maximum width of 4 to 6 mm, so that the width-to-depth ratio which hitherto could be achieved only under a vacuum was reached to virtually the full extent.

What is claimed is:

1. A process for the electron beam welding under environmental pressures of at least 10 mbar of workpieces along a seam therebetween, comprising the steps of:

providing an electron gun having an outermost aperture through which the electron beam produced by the gun can pass;

focusing the beam before the aperture to effect the emission of a highly focused beam through the aperture; and concentrating the focused beam and directing same to the seam to be welded with a concomitant reduction of the free access of the environmental atmosphere on the concentrated beam by positioning guide surfaces for the beam electrons in the environmental atmosphere between the aperture and the seam symmetrically spaced from the axis of the beam to effect impingement of diverging electrons at an acute angle with respect to the guide surfaces and reflection thereof to the seam.

2. Process of claim 1, wherein the guide surfaces are defined by generatrices and the positioning of the guide surfaces comprises disposing the generatrices of the guide surfaces substantially parallel to and symmetrical with the beam axis, the guide surfaces having a length in the beam direction of at least 10 mm and the distance between the guide surfaces diametrically of the electron beam is greater than the focused beam diameter.

3. Process of claim 1, wherein the step of positioning the guide surfaces comprises widening the seam over a portion of the depth of the workpiece to form a gap between the wall portions of the workpieces with the wall portions forming the gap comprising the guide surfaces and wherein the unwidened portion of the seam is welded first, and thereafter the gap is welded, with the delivery of additional material.

4. Process of claim 1, wherein the guide surfaces are formed by a separate body provided in front of the seam in the beam direction.

5. Process of claim 1, wherein the step of positioning the guide surfaces comprises defining a gap parallel to the seam and heating the atmosphere in the gap ahead of and behind the electron beam by additional energy sources.

6. An apparatus for electron beam welding under environmental pressures of at least 10 mbar of workpieces along a seam therebetween, comprising:

electron gun means for producing an electron beam and having an outermost aperture and means disposed before the aperture in the direction of the beam for focusing the beam to effect the emission of a highly focused beam through the aperture; and means for concentrating the focused beam and directing same to the seam to be welded with a concomitant reduction of the free access of the environmental atmosphere on the concentrated beam comprising means defining guide surfaces for the beam electrons disposed in the environmental atmosphere between the aperture and the seam symmetrically spaced from the axis of the beam to effect impingement of diverging electrons at an acute angle with respect to the guide surfaces and reflection thereof to the seam.

7. Apparatus according to claim 6 wherein the electron beam gun means comprises a cathode that can be driven in a high vacuum, a cascade pressure system associated with the gun means to enable the emission of the electron beam out of the aperture into a region of higher pressure, wherein said guide surfaces are spaced apart a distance diametrically of the electron beam which is greater than the beam diameter immediately after the beam entry into the region of higher pressure, the generatrices of the guide surfaces being substantially parallel and symmetrical with the beam axis and having in the beam direction a length of at least 20 mm.

8. Apparatus of claim 6, wherein the means for concentrating further comprises electronic-optical means.

9. Apparatus of claim 6, wherein the means defining the guide surfaces comprises cooling passages therefor.

10. Apparatus of claim 6, wherein the means defining the guide surfaces comprises heating means.

11. Apparatus of claim 6, wherein the means defining guide surfaces is connected to the electron beam gun means and moveable therewith relative to the workpieces along the seam between the workpieces, and the guide surfaces comprises a substantially cylindrical inner wall.

12. Apparatus of claim 6, wherein the means defining the guide surfaces is stationary with respect to the workpieces during welding, and the guide surfaces comprise the wall surfaces of a gap substantially parallel to the seam.

13. Process of clam 5 wherein plasma burners are used as the energy sources.

14. Process according to claim 2, wherein the length of the guide surfaces in the beam direction is at least 20 mm.

* * * * *